United States Patent
Peachey et al.

(10) Patent No.: US 8,824,217 B2
(45) Date of Patent: Sep. 2, 2014

(54) ELECTRO-STATIC DISCHARGE POWER SUPPLY CLAMP WITH DISABLEMENT LATCH

(71) Applicant: RF Micro Devices, Inc., Greensboro, NC (US)

(72) Inventors: Nathaniel Peachey, Oak Ridge, NC (US); Joseph Hubert Colles, Bonsall, CA (US); Jeffrey D. Potts, Mocksville, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/929,950

(22) Filed: Jun. 28, 2013

(65) Prior Publication Data

US 2013/0286519 A1 Oct. 31, 2013

Related U.S. Application Data

(62) Division of application No. 12/913,060, filed on Oct. 27, 2010, now Pat. No. 8,498,166.

(60) Provisional application No. 61/256,742, filed on Oct. 30, 2009.

(51) Int. Cl.

| | | |
|---|---|---|
| G11C 7/10 | (2006.01) | |
| H02H 3/00 | (2006.01) | |
| H02H 5/06 | (2006.01) | |
| G11C 7/00 | (2006.01) | |
| G11C 5/14 | (2006.01) | |
| G11C 7/12 | (2006.01) | |
| G11C 7/22 | (2006.01) | |
| G11C 5/06 | (2006.01) | |

(52) U.S. Cl.
CPC .. *G11C 7/12* (2013.01); *G11C 7/22* (2013.01); *G11C 7/1051* (2013.01); *G11C 5/147* (2013.01); *G11C 5/06* (2013.01); *G11C 7/1078* (2013.01)
USPC ... 365/189.06; 365/63; 365/154; 365/189.08; 361/56; 361/111

(58) Field of Classification Search
CPC .......... G11C 7/12; G11C 7/22; G11C 7/1078; G11C 7/1051; G11C 5/147; G11C 5/06; G11C 7/00
USPC .......................... 365/63, 154, 189.06, 189.08
See application file for complete search history.

(56) References Cited

U.S. PATENT DOCUMENTS

2006/0176626 A1* 8/2006 Griesbach et al. ............... 361/56
2007/0097570 A1* 5/2007 Chatty et al. ..................... 361/56

(Continued)

OTHER PUBLICATIONS

Smith, J.C. et al, "A Mosfet power supply clamp with feedback enhanced triggering for ESD protection in advanced CMOS technologies," Electrical Overstress/Electrostatic Discharge Symposium, Sep. 21-25, 2003, pp. 1-9.

(Continued)

*Primary Examiner* — Ly D Pham
(74) *Attorney, Agent, or Firm* — Withrow & Terranova, P.L.L.C.

(57) ABSTRACT

The described devices, systems and methods include an electro-static discharge clamp with a latch to prevent false triggering of an electro-static discharge protection circuit in response to fluctuations in a power supply rail.

3 Claims, 9 Drawing Sheets

(56) References Cited

U.S. PATENT DOCUMENTS

| | | | |
|---|---|---|---|
| 2008/0239599 A1* | 10/2008 | Yizraeli et al. | 361/56 |
| 2009/0040671 A1* | 2/2009 | Zhang | 361/56 |
| 2010/0277847 A1* | 11/2010 | Li | 361/111 |

OTHER PUBLICATIONS

Worley, E.R. et al, "Sub-micron chip ESD protection schemes which avoid avalanching junctions," Electrical Overstress/Electrostatic Discharge Symposium Proceedings, Sep. 12, 1995, pp. 13-20.

Restriction Requirement for U.S. Appl. No. 12/193,060, mailed Dec. 4, 2012, 7 pages.

Non-Final Office Action for U.S. Appl. No. 12/913,060, mailed Dec. 27, 2012, 7 pages.

Notice of Allowance for U.S. Appl. No. 12/913,060, mailed Apr. 1, 2013, 9 pages.

Notice of Allowance for U.S. Appl. No. 13/929,933, mailed Oct. 2, 2013, 9 pages.

Non-Final Office Action for U.S. Appl. No. 13/929,933, mailed Dec. 5, 2013, 6 pages.

* cited by examiner

ELECTRO-STATIC DISCHARGE POWER SUPPLY CLAMP WITH DISABLEMENT LATCH

This application is a Divisional filing of U.S. patent application Ser. No. 12/913,060, filed Oct. 27, 2010, now U.S. Pat. No. 8,498,166, which claims the benefit of U.S. provisional patent application No. 61/256,742, filed Oct. 30, 2009, the disclosures of which are incorporated herein by reference in their entireties.

FIELD OF THE DISCLOSURE

This application relates to electro-static discharge (ESD) protection circuits. The application further relates to preventing false triggering of an ESD protection circuit in response to fluctuations on the power supply.

BACKGROUND

Power supply clamps are used for ESD protection in complementary metal oxide semiconductor (CMOS) circuits. FIG. 1 depicts a common ESD protection circuit 10 for an integrated circuit consisting of a resistor-capacitor (RC) time constant network 12 composed of a resistor 14 and a capacitor 16. The RC time constant network 12 is connected to an inverter 18, which in turn drives a transistor array 20 to clamp the power supply to ground during the ESD event. The ESD protection circuit 10 is designed to stay on only long enough to dissipate the ESD pulse and then turn off again. The length of time that the ESD protection circuit 10 is on is controlled by the RC time constant connected to the inverter 18. One notable feature of the ESD protection circuit 10 is that each time the integrated circuit is powered up, a current spike occurs while the clamp is on prior to the RC trigger timing out. For most applications, this short surge of current is purely incidental and is not detrimental to the functioning of the integrated circuit.

However, the ESD protection circuit 10 may also turn on when voltage transients cause large enough swings on the supply rails. If these voltage transients are inherent to an application, for example with dc to dc buck converters, the transistor array 20 can stay on indefinitely, which draws down the power rail. Another scenario where the ESD protection circuit 10 may be problematic is when the power supply is current limited such that the power supply is drawn down when the transistor array 20 turns on momentarily at startup of the integrated circuit. When the RC time constant releases, the voltage suddenly spikes up. At this point, the clamp may turn on again and a recurring oscillation ensues.

Thus, there is a need for a new ESD clamp circuit that is insensitive to the transients produced on the power rail of an integrated circuit.

SUMMARY OF THE DETAILED DESCRIPTION

Embodiments in the detailed description relate to an ESD clamp with a latch to preventing false triggering of an ESD protection circuit in response to fluctuations in a power supply. As a first example, an ESD clamp includes a resistor coupled to a power supply node of an integrated circuit. A capacitor is coupled to the resistor to form a first node, wherein the capacitor is also coupled to a common node of the integrated circuit. A first p-type field effect transistor (PFET) includes a gate, a source coupled to the power supply node, and a drain coupled to the first node. An inverter includes an inverter input and an inverter output, wherein the inverter input is in communication with the first node and the inverter output is in communication with the gate of the first PFET. In addition, the ESD clamp includes an n-type field effect transistor (NFET) including a gate in communication with the inverter output, a drain coupled to the power supply node, and a source coupled to the common node.

A second example of an electro-static discharge (ESD) clamp includes a resistor coupled to a power supply node of an integrated circuit and a capacitor coupled to the resistor to form a first node. The capacitor is further coupled to a common node of the integrated circuit. The ESD clamp also includes a first NFET including a gate, a source coupled to the first node, and a drain coupled to the power supply node. The ESD claim further includes a first inverter including a first inverter input and a first inverter output, wherein the first inverter input is in communication with the first node and a second inverter including a second inverter input and a second inverter output, wherein the second inverter input is coupled to the first inverter output to form a second node, and the second inverter output is coupled to the gate of the first NFET. The ESD clamp also includes a second NFET including a gate coupled to the second node, a drain coupled to the power supply node, and a source coupled to a common node.

Yet another ESD clamp includes a resistor coupled to a power supply node and a first capacitor coupled to a common node and further coupled to the first resistor to form a first node. The ESD clamp also includes a first inverter including a first inverter input coupled to the first node, a first inverter output coupled to a second node, and a clear input, wherein the first inverter is configured to output a logic low level upon assertion of the clear input. The ESD clamp further includes a second inverter including a second inverter input coupled to the second node, and an inverter output coupled to the clear input of the first inverter and a first NFET including a gate coupled to the second node, a drain coupled to the power supply node, and a gate coupled to the common node.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

The described devices, systems and methods relate to an ESD clamp with a latch to preventing false triggering of an ESD protection circuit in response to fluctuations in the power supply. As a first example, an ESD clamp includes a resistor coupled to a power supply node of an integrated circuit. A capacitor is coupled to the resistor to form a first node, wherein the capacitor is also coupled to a common node of the integrated circuit. A first PFET includes a gate, a source coupled to the power supply node, and a drain coupled to the first node. An inverter includes an inverter input and an inverter output, wherein the inverter input is in communication with the first node and the inverter output is in communication with the gate of the first PFET. In addition, the ESD clamp includes an NFET including a gate in communication with the inverter output, a drain coupled to the power supply node, and a source coupled to the common node. When the power supply node is powered up, the second PFET is turned on, which keeps the input of the inverter asserted. As a consequence, the output of the inverter is held at a logic low level, which prevents the NFET from sinking current from the power supply node during a power glitch.

Figure 1:
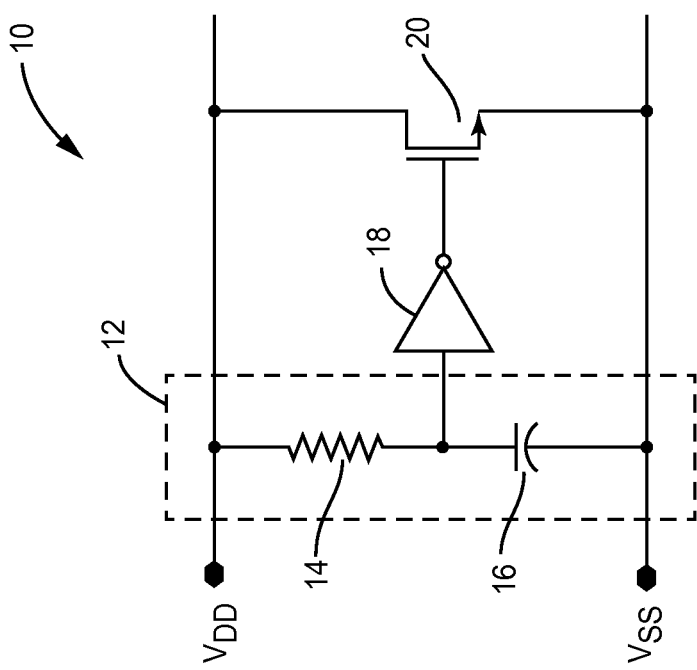
FIG. 1 depicts an ESD clamp.
Figure 2:
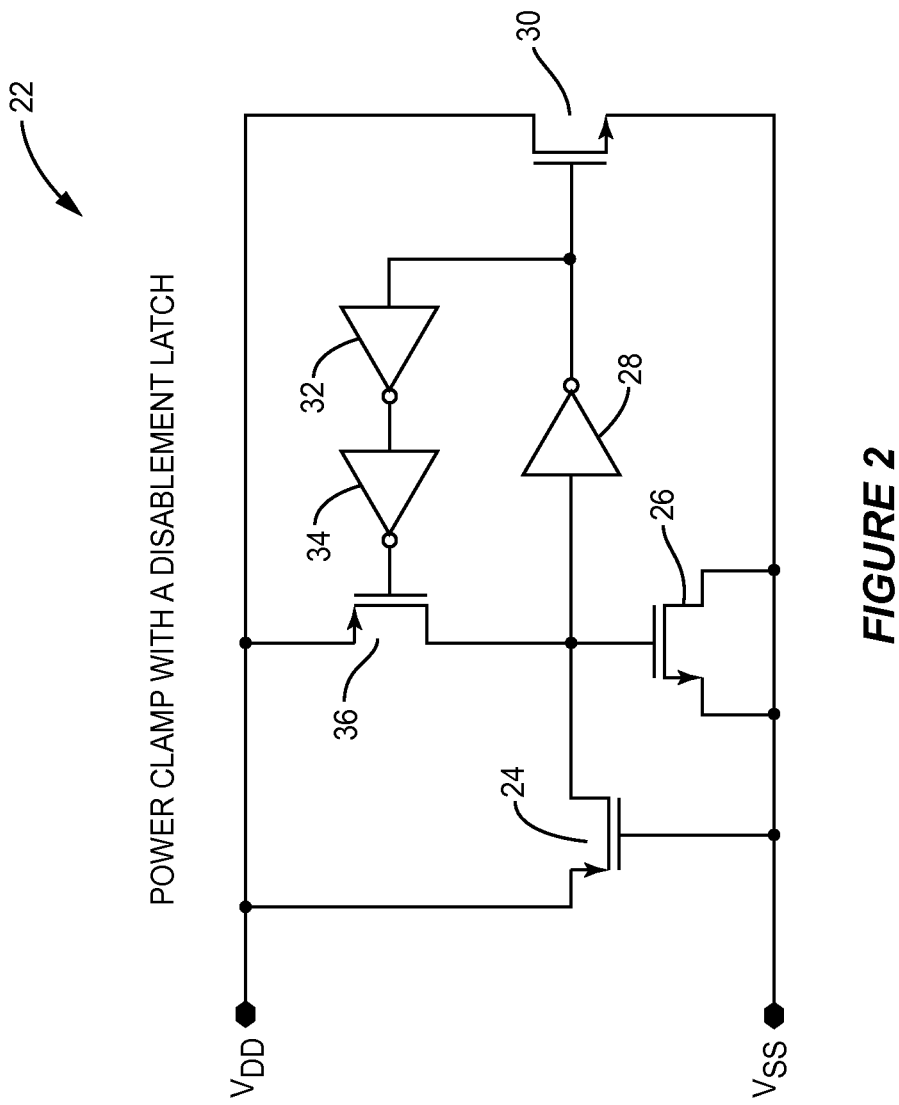
FIG. 2 depicts an example power clamp with a disablement latch.

FIG. 2 depicts a power clamp with a disablement latch 22 having a first PFET configured as a dynamic resistor 24 coupled to a second PFET configured as a MOS capacitor 26. The dynamic resistor 34 is coupled to the power supply node ($V_{DD}$) of an integrated circuit and the MOS capacitor 26 to form a resistor capacitor (RC) time constant circuit. The MOS capacitor 26 is further coupled to a common voltage ($V_{SS}$). In some embodiments the common voltage ($V_{SS}$) may be ground.

A first inverter 28 includes an inverter input coupled to the junction of the dynamic resistor 24 and MOS capacitor 26. The inverter output of the first inverter 28 is coupled to a gate of NFET 30. The drain of the NFET 30 may be coupled to the power supply node ($V_{DD}$) of the integrated circuit. The source of the NFET 30 may be coupled to the common voltage ($V_{SS}$). The NFET 30 may be an array of transistors.

The power clamp with the disablement latch 22 further includes a second inverter 32 coupled in series with a third inverter 34, where the input of the second inverter 32 is coupled to the inverter output of the first inverter 28. The inverter output of the third inverter 34 is coupled to the gate of the third PFET 36. The drain of the third PFET 36 is coupled to the inverter input of the first inverter 28.

Functionally, when no power is applied to the power supply node ($V_{DD}$), the power clamp with the disablement latch 22 is in a power down mode, and all the nodes are nominally at a zero volt potential. Upon receipt of an ESD discharge, the MOS capacitor 26 holds the input of the first inverter 28 low while turning on the first inverter 28. As a result, the first inverter 28 provides a turn-on voltage to the gate of the NFET 30. In response to the voltage applied to the gate of the NFET 30, the NFET 30 shunts the EDS current to ground. The third PFET 36 is turned off. The MOS capacitor 26 is charged up through the dynamic resistor 24. After the turn-on voltage applied to the MOS capacitor 26 reaches the logic threshold level of the first inverter 28, the first inverter 28 asserts a logic low output, which turns off the NFET 30 and turns on the third PFET 36.

Alternatively, when power is applied to the power supply node ($V_{DD}$), the MOS capacitor 26 is charged up through the dynamic resistor 24. After the voltage applied to the MOS capacitor 26 reaches the logic threshold level of the first inverter 28, the first inverter 28 asserts a logic low output, which turns off the NFET 30. Likewise, the feedback of the output of the first inverter 28 to the third PFET 36 ensures that the input of the first inverter 28 remains pulled high in the event there is a glitch or some instability on the power supply node ($V_{DD}$).

Figure 3:
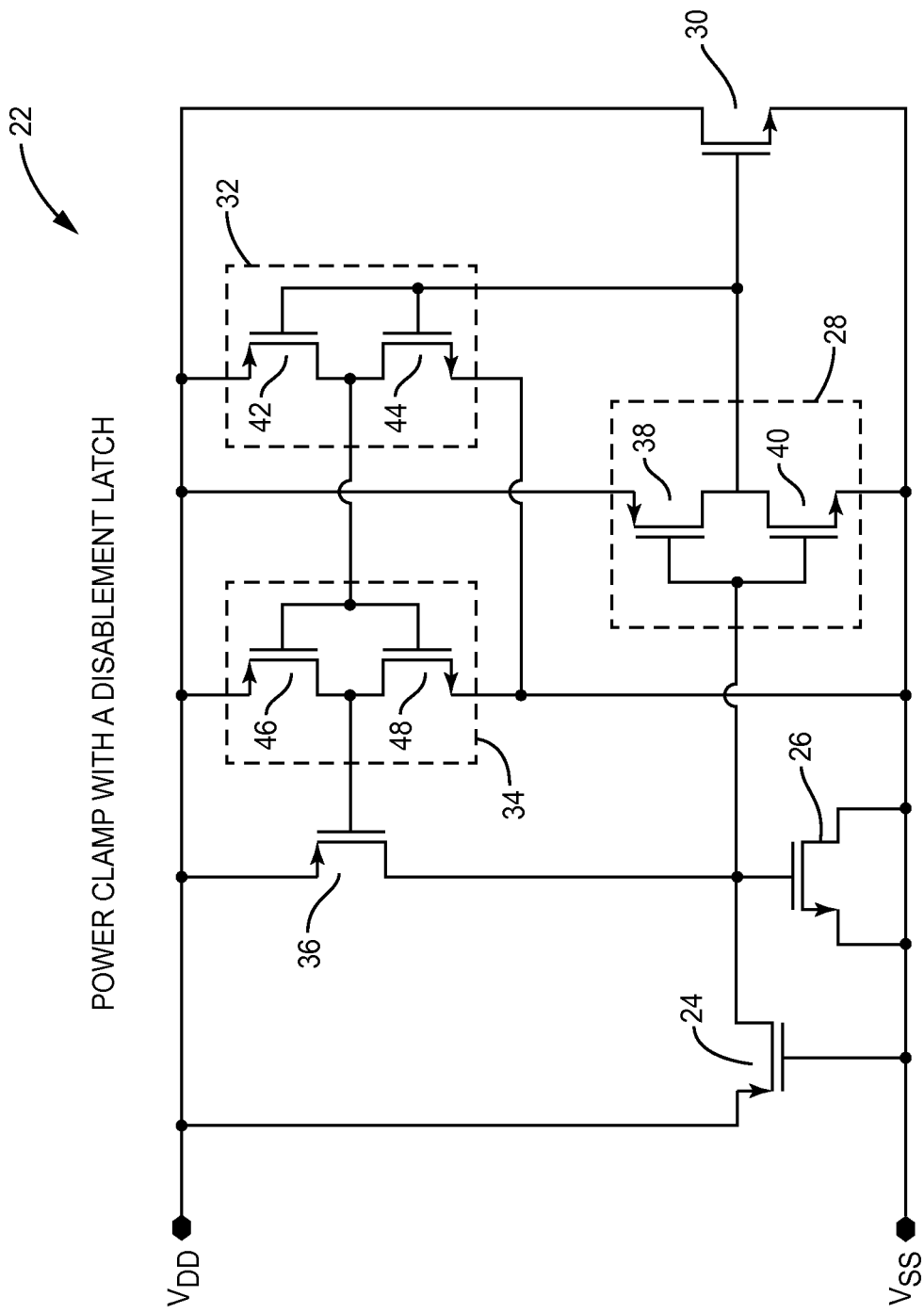
FIG. 3 depicts a transistor level power clamp with a disablement latch of FIG. 2.

FIG. 3 depicts a transistor implementation of the power clamp with a disablement latch 22. The first inverter 28 is composed of a fourth PFET 38 coupled to a second NFET 40. The second inverter 32 includes a fifth PFET 42 coupled to a third NFET 44. The third inverter 34 includes a sixth PFET 46 coupled to a fourth NFET 48.

Figure 4:
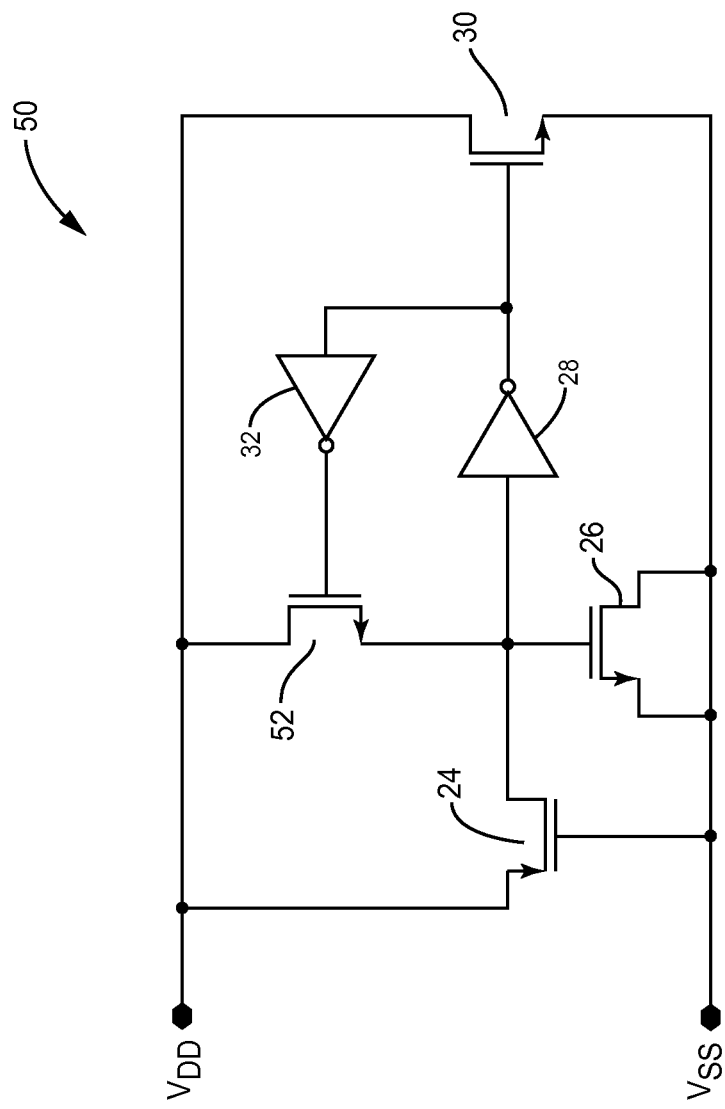
FIG. 4 depicts an example power clamp with disablement latch.
Figure 5:
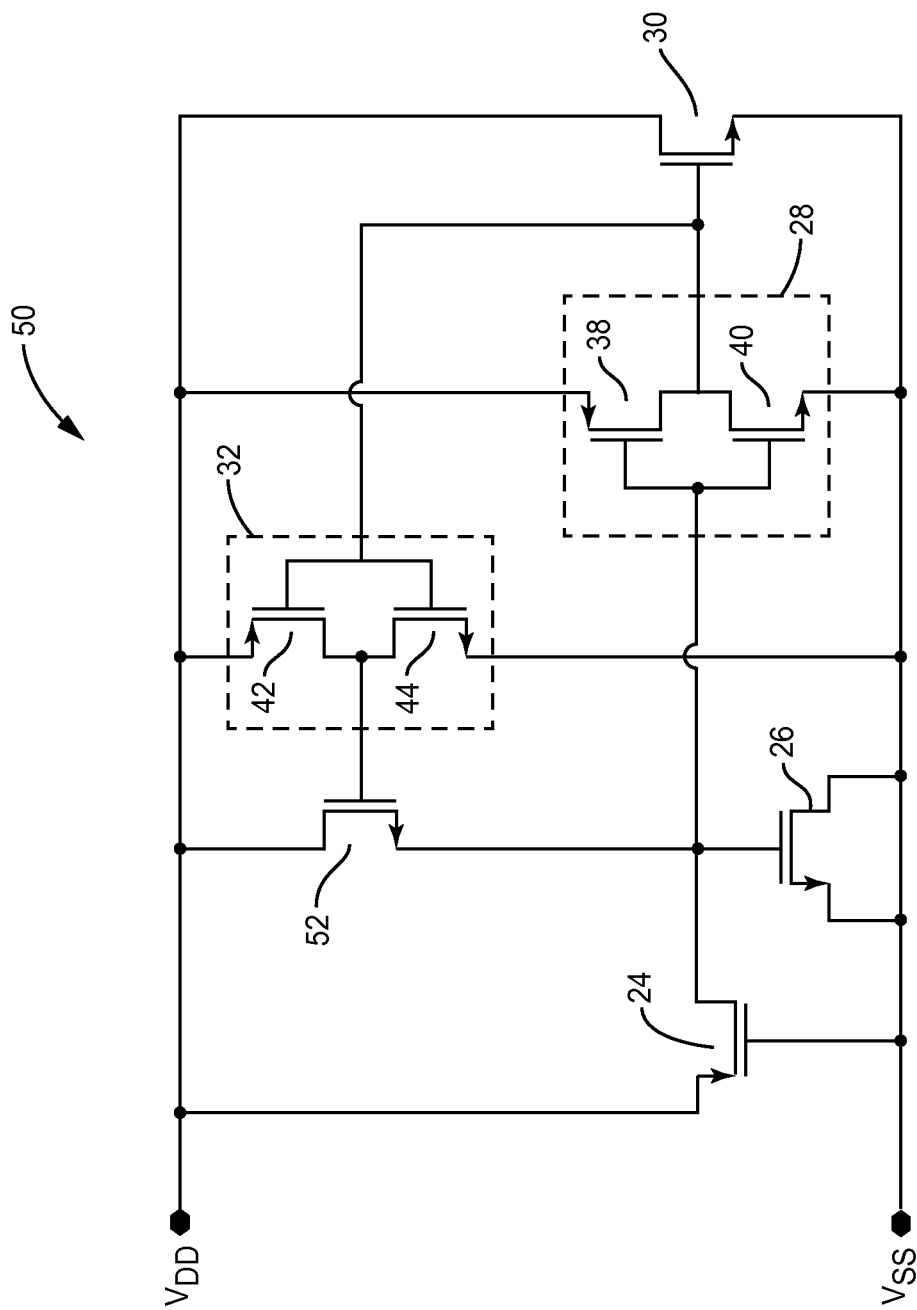
FIG. 5 depicts a transistor level power clamp with a disablement latch of FIG. 4.

FIGS. 4 and 5 depict an ESD clamp with disablement latch 50 which is similar to the ESD clamp with disablement latch 22 depicted in FIGS. 2 and 3. As shown in FIG. 5, the ESD clamp with disablement latch 50 removes the third inverter 34 and replaces the third PFET 36 with a fifth NFET 52. The source of the fifth NFET 52 is coupled to the input of the first inverter 28. The drain of the fifth NFET 52 is coupled to the power supply node ($V_{DD}$).

Continuing with reference to FIG. 4, functionally, the ESD clamp with disablement latch 50 operates similarly to the ESD clamp with disablement latch 22 except that the second inverter 32 asserts a logic high signal on the gate of the fifth NFET 52, which causes the fifth NFET 52 to go into saturation. When the fifth NFET 52 is in saturation, the output of the first inverter 28 is held low, which turns off the NFET 30.

Alternatively, when power is applied to the power supply node ($V_{DD}$), the MOS capacitor 26 is charged through the dynamic resistor 24. After the voltage applied to the MOS capacitor 26 reaches the logic threshold level of the first inverter 28, the first inverter 28 asserts a logic low output, which turns off the NFET 30. Likewise, the feedback of the output of the first inverter 28 to the fifth NFET 52 ensures that the input to the first inverter 28 remains pulled high in the event there is a glitch or some instability on the power supply node ($V_{DD}$).

FIG. 5 depicts a transistor level diagram of the ESD clamp with disablement latch 50.

Figure 6:
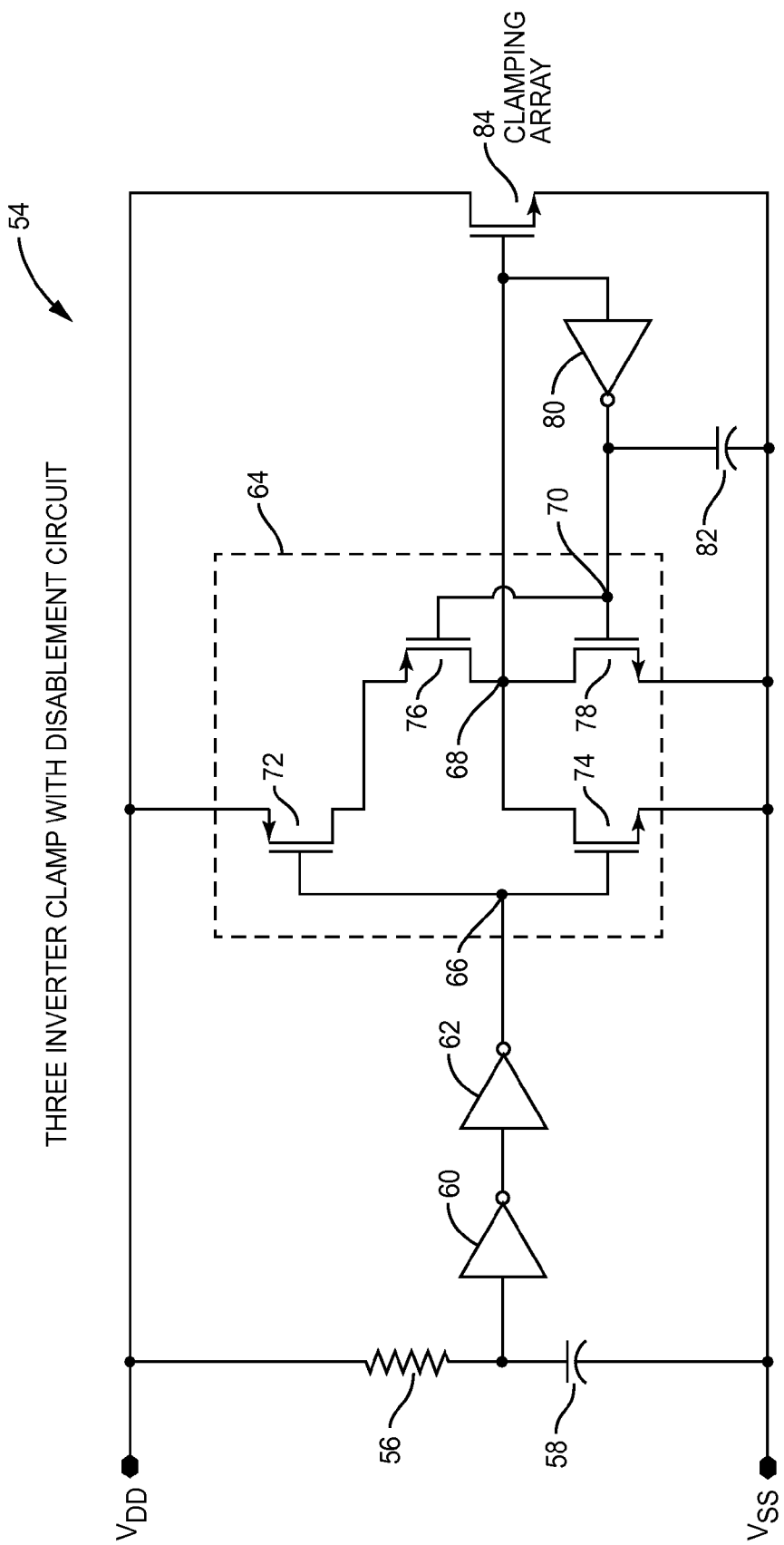
FIG. 6 depicts a three inverter clamp with disablement circuit.

FIG. 6 depicts a single inverter clamp with disablement circuit having a first resistor 56 coupled to the power supply node ($V_{DD}$) and a first capacitor 58. The first capacitor 58 is coupled to the common node ($V_{SS}$), which may be ground. The input of a first inverter 60 is coupled to the first resistor 56 and first capacitor 58. The output of the first inverter 62 is coupled to the input of a second inverter 62. The output of the second inverter 62 is coupled to the input of an inverter with clear circuit 64.

The inverter with clear circuit 64 includes an inverter input 66, and inverter output 68, and a clear input 70. The inverter with clear circuit 64 is configured to output a logic low level upon assertion of the clear input 70. Otherwise, the inverter with clear circuit 64 operates as an inverter when the clear input 70 is deasserted.

The inverter with clear circuit 64 includes a first PFET 72 coupled to a first NFET 74 to form the inverter input 66. The drain of the first PFET 72 is coupled to the source of a second PFET 76. The drain of the second PFET 76 is coupled to the drain of the first NFET 74 to form the inverter output 68. The gate of the second PFET 76 and the gate of a second NFET 78 are coupled to form the clear input 70 of the inverter with clear circuit 64. The drain of the second NFET 78 is also coupled to the inverter output 68.

Functionally, when the clear input 70 is deasserted to a logic level low, the inverter with clear circuit 64 functions as an inverter. The second PFET 76 is turned on and the second NFET 78 is turned off.

However, when the clear input 70 is asserted to a logic level high, the inverter with clear circuit 64 outputs a logic level low on the inverter output 68 of the inverter with clear circuit 64. The second PFET 76 is turned off and the second NFET 78 is turned on, which forces the inverter output to a logic level low.

Continuing with the description of the three inverter clamp with disablement circuit 54, the inverter output 68 is coupled to the first NFET 74 and an inverter input of the third inverter 80. The output of the third inverter 80 is coupled to a second capacitor 82 and the clear input 70.

Operationally, when no power is applied to the power supply node ($V_{DD}$), the three inverter clamp with disablement circuit 54 is in a power down mode and all the nodes are nominal at a zero volt potential. Upon receipt of an ESD discharge, the first capacitor 58 holds the input of the first inverter 60 at a logic level low, which causes the second inverter 62 to assert a logic level high output. Likewise, the second capacitor 82 holds the clear input 70 at a logic level low, which enables the inverter with clear circuit 64 to assert a logic level high at the inverter output 68. This, in turn, turns on the clamping array 84. The logic level high at the inverter output 68 asserts the third inverter 80, which reinforces the clear input 70 to be held low until the ESD energy is discharged through the clamping array 84.

Alternatively, when power is applied to the power supply node ($V_{DD}$), the first capacitor 58 reaches the logic threshold level of the first inverter 60, which turns off the clamping array 84 and asserts a logic level low on the inverter input of the third inverter 80. As a result, the clear input 70 of the inverter with clear circuit 64 is asserted to a logic level high, which reinforces the inverter output 68 to remain at the logic level low.

Figure 7:
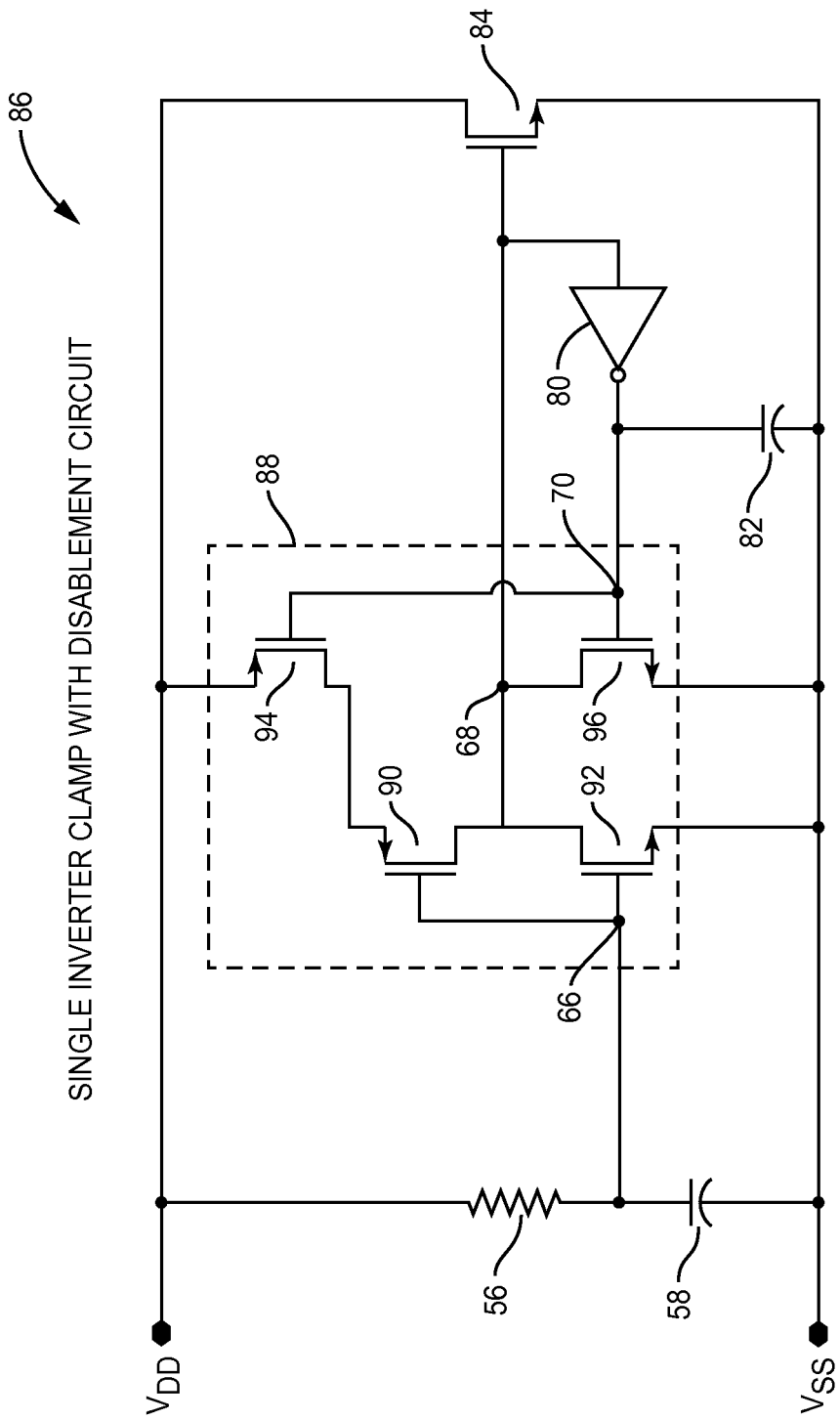
FIG. 7 depicts a single inverter clamp with disablement circuit.

As depicted in FIG. 7, the single inverter clamp with disablement circuit 86 is functionally the same as the three inverter clamp with disablement circuit 54 except the first inverter 60 and the second inverter 62 are removed. As a consequence, the inverter input 66 of the inverter with clear circuit 64 is directly coupled to the first capacitor 58 and first resistor 56.

The single inverter clamp with disablement circuit 86 is functionally equivalent to the inverter with clear circuit 64. The inverter with clear circuit 88 includes a first PFET 90 and a first NFET 92 coupled to form the inverter input 66 and inverter output 68. The second PFET 94 is coupled to the source of the first PFET 90, which acts to disable the inverter output 68 when the clear input 70 is asserted. Similar to the second NFET 78 of the three inverter with disablement circuit 54, a drain of a second NFET 96 is coupled to the inverter output 68, which acts to pull down the inverter output 68 when the clear input 70 is asserted.

Figure 8:
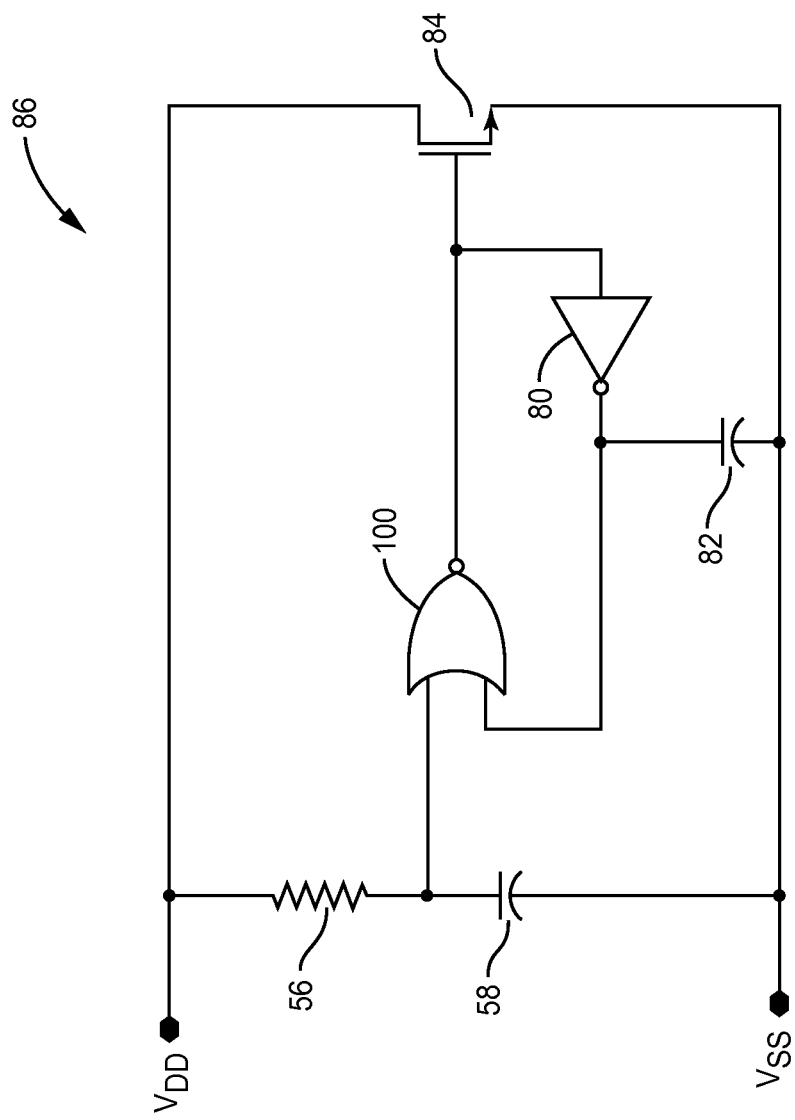
FIG. 8 depicts an example power clamp having a NOR circuit with disablement circuit.

As depicted in FIG. 8, the single inverter clamp with disablement circuit 86 depicted in FIG. 7 may be replaced by a NOR circuit 100. The first input of the NOR circuit 100 may be coupled to the first capacitor 58 and first resistor 56. The output of the NOR circuit 100 may be coupled to the clamping array 84 and the input of the third inverter 80. The output of the third inverter 80 is coupled to the second input of the NOR circuit 100 and to the second capacitor 82. As before, the second capacitor 82 and transmission time of the third inverter 80 delays the output of the third inverter 80 to permit the clamping array 84 to stay on for a desired period of time.

Figure 9:
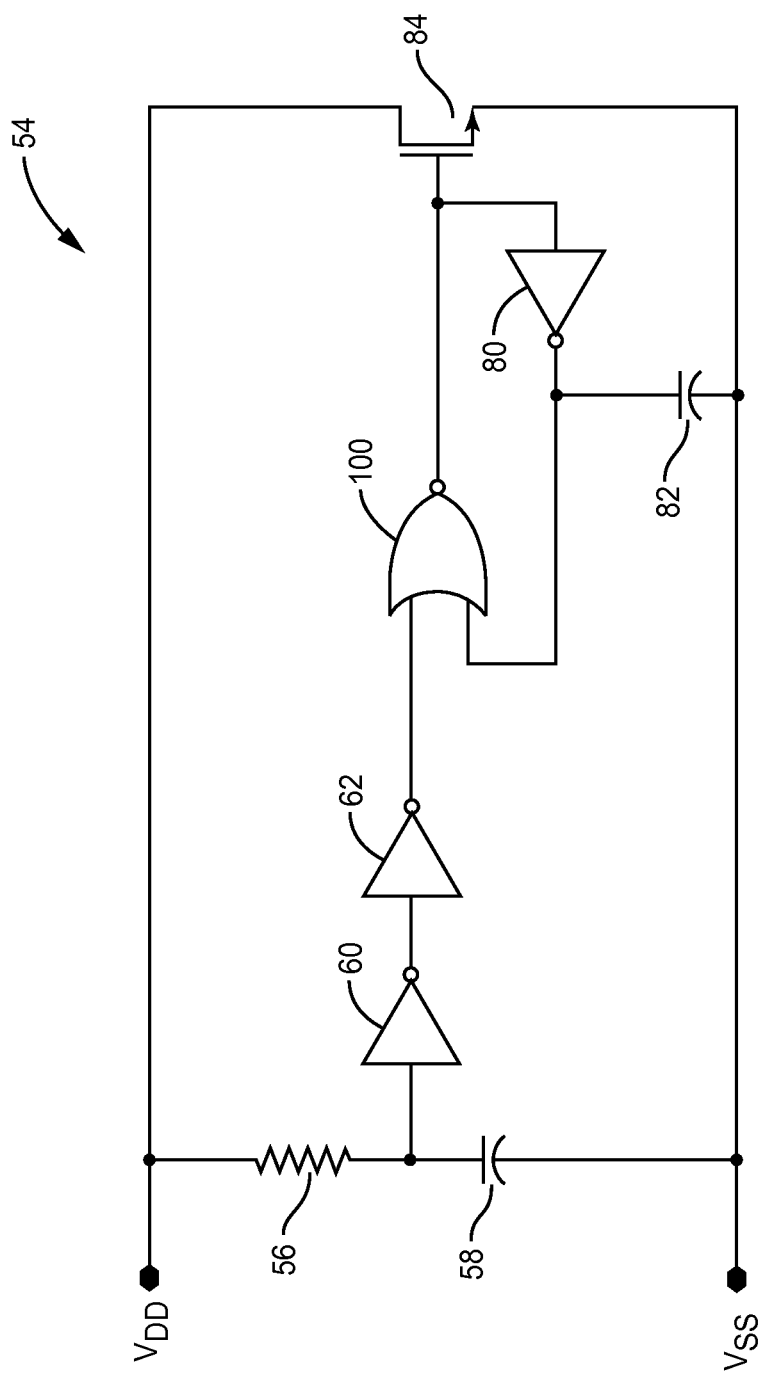
FIG. 9 depicts an example power clamp having a NOR circuit with disablement circuit.

As depicted in FIG. 9, the inverter with clear circuit 64 depicted in FIG. 6 may likewise be replaced with a NOR circuit 100. Similar to above, the first resistor 56 and first capacitor 58 are coupled to the input of the first inverter 60. The output of the first inverter 60 is coupled to the input of the second inverter 62. The first inverter 60 and second inverter 62 provide a delay before the NOR circuit 100 detects a transient spike on the $V_{DD}$. Otherwise, the circuit of FIG. 9 functionally operates similar to the circuit of FIG. 8.

Those skilled in the art will recognize improvements and modifications to the embodiments of the present disclosure. All such improvements and modifications are considered within the scope of the concepts disclosed herein and the claims that follow.

What is claimed is:

1. A circuit for protecting integrated circuitry comprising:
  an integrated circuit including a power supply node and a common node;
  a resistor coupled to the power supply node;
  a capacitor coupled to the common node and further coupled to the resistor to form a first node;
  a NOR circuit including a first NOR circuit input in communication with the first node, a NOR circuit output coupled to a second node, and a second NOR circuit input;
  an inverter including an inverter input coupled to the second node, and an inverter output coupled to the second NOR circuit input to provide the second NOR circuit input with a logic state that is the same as an instantaneous logic state of the inverter output;
  a NFET including a gate coupled to the second node, a drain coupled to the power supply node, and a source coupled to the common node.

2. The circuit for protecting integrated circuitry of claim 1 wherein the common node is a ground node of the integrated circuit.

3. The circuit for protecting integrated circuitry of claim 1 wherein the capacitor is a first capacitor, and the circuit further includes a second capacitor coupled between an output of the second inverter and the common node.

* * * * *